United States Patent
Weakley et al.

(10) Patent No.: US 7,154,283 B1
(45) Date of Patent: Dec. 26, 2006

(54) METHOD OF DETERMINING PERFORMANCE OF RFID DEVICES

(75) Inventors: T. Craig Weakley, Simpsonville, SC (US); Ian J. Forster, Chelmsford (GB)

(73) Assignee: Avery Dennison Corporation, Pasadena, CA (US)

( * ) Notice: Subject to any disclaimer, the term of this patent is extended or adjusted under 35 U.S.C. 154(b) by 0 days.

(21) Appl. No.: 11/359,669

(22) Filed: Feb. 22, 2006

(51) Int. Cl.
G01R 31/302 (2006.01)
G08B 13/14 (2006.01)

(52) U.S. Cl. .................. 324/750; 340/572.1

(58) Field of Classification Search ........... 324/667, 324/605, 158.1, 754, 750, 763–765; 340/572.1, 340/572.2, 572.4, 572.5, 572.6, 572.7, 10.1; 702/10.1, 18–186, 194, 195
See application file for complete search history.

(56) References Cited

U.S. PATENT DOCUMENTS

| | | | |
|---|---|---|---|
| 3,579,113 A | 5/1971 | Jabbar et al. |
| 4,876,535 A | 10/1989 | Ballmer et al. |
| 5,153,983 A | 10/1992 | Oyama |
| 5,286,415 A | 2/1994 | Buckley et al. |
| 5,545,291 A | 8/1996 | Smith et al. |
| 5,564,888 A | 10/1996 | Doan |
| 5,573,610 A | 11/1996 | Koch et al. |
| 5,573,611 A | 11/1996 | Koch et al. |
| 5,621,199 A | 4/1997 | Calari et al. |
| 5,781,110 A | 7/1998 | Habeger, Jr. et al. |
| 5,783,856 A | 7/1998 | Smith et al. |
| 5,824,186 A | 10/1998 | Smith et al. |
| 5,854,480 A | 12/1998 | Noto |
| 5,855,820 A | 1/1999 | Chan et al. |
| 5,874,724 A | 2/1999 | Cata |
| 5,880,695 A | 3/1999 | Brown et al. |
| 5,904,545 A | 5/1999 | Smith et al. |
| 5,973,598 A | 10/1999 | Beigel |
| 5,977,877 A | 11/1999 | McCulloch et al. |
| 5,983,363 A | 11/1999 | Tuttle et al. |
| 5,992,739 A | 11/1999 | Maeder |
| 6,001,211 A | 12/1999 | Hiroyuki |
| 6,043,746 A | 3/2000 | Sorrells |
| 6,078,259 A | 6/2000 | Brady et al. |
| 6,104,291 A | 8/2000 | Beauvillier et al. |
| 6,107,920 A | 8/2000 | Eberhardt et al. |

(Continued)

FOREIGN PATENT DOCUMENTS

DE 197 42 126 3/1999

(Continued)

Primary Examiner—Andrew H. Hirshfeld
Assistant Examiner—Hoai-An D. Nguyen
(74) Attorney, Agent, or Firm—Renner, Otto, Boisselle & Sklar, LLP

(57) ABSTRACT

A method of determining far-field performance of an RFID device, such as in or on a tag, label, package, film, carton, wrap, or a portion of any of these, includes performing near-field testing or measurement of the RFID device, and determining or predicting far-field performance based on the results of the near-field testing or measurement. The determining or predicting of far-field performance may involve calculating a measure of far-field performance based on near-field results or measurements. The predicted far-field performance may include any of a variety of performance factors, including range, sensitivity, frequency performance, read sensitivity, write sensitivity, peak operating frequency, and/or average sensitivity over a given frequency band. Using near-field testing results to predict far-field performance may allow use of compact testing facilities, in situ testing of RFID devices, and/or faster and/or less costly testing of RFID devices.

16 Claims, 2 Drawing Sheets

U.S. PATENT DOCUMENTS

| | | | |
|---|---|---|---|
| 6,122,492 A | 9/2000 | Sears | |
| 6,145,901 A | 11/2000 | Rich | |
| 6,147,605 A | 11/2000 | Vega et al. | |
| 6,147,662 A | 11/2000 | Grabau et al. | |
| 6,172,609 B1 | 1/2001 | Lu et al. | |
| 6,204,764 B1 | 3/2001 | Maloney | |
| 6,206,292 B1 | 3/2001 | Robertz et al. | |
| 6,219,543 B1 | 4/2001 | Myers et al. | |
| 6,236,223 B1 * | 5/2001 | Brady et al. | 324/765 |
| 6,236,316 B1 | 5/2001 | Eberhardt et al. | |
| 6,259,408 B1 | 7/2001 | Brady et al. | |
| 6,262,292 B1 | 7/2001 | Yasuda et al. | |
| 6,262,692 B1 | 7/2001 | Babb et al. | |
| 6,265,977 B1 | 7/2001 | Vega et al. | |
| 6,274,508 B1 | 8/2001 | Jacobsen et al. | |
| 6,281,038 B1 | 8/2001 | Jacobsen et al. | |
| 6,291,896 B1 | 9/2001 | Smith | |
| 6,316,278 B1 | 11/2001 | Jacobsen et al. | |
| 6,346,886 B1 | 2/2002 | De La Huerga | |
| 6,380,729 B1 | 4/2002 | Smith | |
| 6,384,727 B1 | 5/2002 | Diprizio et al. | |
| 6,390,650 B1 * | 5/2002 | Brandt et al. | 362/293 |
| 6,392,544 B1 | 5/2002 | Collins et al. | |
| 6,404,339 B1 | 6/2002 | Eberhardt | |
| 6,407,665 B1 | 6/2002 | Maloney | |
| 6,415,978 B1 | 7/2002 | McAllister | |
| 6,417,025 B1 | 7/2002 | Gengel | |
| 6,417,026 B1 | 7/2002 | Gengel | |
| 6,446,208 B1 | 9/2002 | Gujar et al. | |
| 6,451,154 B1 | 9/2002 | Grabau et al. | |
| 6,463,798 B1 | 10/2002 | Niekerk et al. | |
| 6,487,681 B1 | 11/2002 | Tuttle et al. | |
| 6,545,605 B1 | 4/2003 | Van Horn et al. | |
| 6,600,420 B1 | 7/2003 | Goff et al. | |
| 6,606,247 B1 | 8/2003 | Credelle et al. | |
| 6,661,410 B1 | 12/2003 | Casebolt et al. | |
| 6,677,852 B1 | 1/2004 | Landt | |
| 6,683,254 B1 | 1/2004 | Gunnels | |
| 6,690,264 B1 | 2/2004 | Dalglish | |
| 6,720,866 B1 | 4/2004 | Sorrells et al. | |
| 6,774,782 B1 | 8/2004 | Runyon et al. | |
| 6,825,754 B1 | 11/2004 | Rolin | |
| 6,891,110 B1 | 5/2005 | Pennaz et al. | |
| 6,933,848 B1 | 8/2005 | Stewart et al. | |
| 6,940,408 B1 | 9/2005 | Ferguson et al. | |
| 6,940,455 B1 | 9/2005 | Plettner | |
| 7,023,342 B1 * | 4/2006 | Corbett et al. | 340/572.1 |
| 7,059,518 B1 * | 6/2006 | Forster | 235/385 |
| 2001/0054755 A1 | 12/2001 | Kirkham | |
| 2002/0092347 A1 | 7/2002 | Niekerk et al. | |
| 2002/0130771 A1 | 9/2002 | Osborne et al. | |
| 2002/0145520 A1 | 10/2002 | Maloney | |
| 2004/0032330 A1 | 2/2004 | Becker et al. | |
| 2004/0046020 A1 | 3/2004 | Andreasson et al. | |
| 2004/0046643 A1 | 3/2004 | Becker et al. | |
| 2004/0059629 A1 | 3/2004 | Luo et al. | |
| 2004/0066280 A1 | 4/2004 | Pratt et al. | |
| 2004/0160233 A1 | 8/2004 | Forster | |
| 2004/0195319 A1 | 10/2004 | Forster | |
| 2005/0155213 A1 * | 7/2005 | Eastin | 29/593 |
| 2005/0212660 A1 | 9/2005 | Hansen et al. | |
| 2005/0223286 A1 * | 10/2005 | Forster | 714/25 |
| 2005/0230486 A1 | 10/2005 | Halope | |
| 2005/0231371 A1 | 10/2005 | Rowe, Jr. | |
| 2005/0242957 A1 | 11/2005 | Lindsay et al. | |
| 2006/0125640 A1 * | 6/2006 | Oakes et al. | 340/572.7 |
| 2006/0145710 A1 * | 7/2006 | Puleston et al. | 324/750 |
| 2006/0202705 A1 * | 9/2006 | Forster | 324/750 |

FOREIGN PATENT DOCUMENTS

| | | |
|---|---|---|
| DE | 298 13 738 | 3/1999 |
| DE | 101 20 625 | 4/2001 |
| DE | 10 2004 015 994 | 11/2005 |
| EP | 0 896 706 | 6/2000 |
| EP | 1 459 911 | 9/2004 |
| EP | 1 538 556 | 6/2005 |
| JP | 2004-246816 | 9/2004 |
| WO | WO 82/00541 | 2/1992 |
| WO | WO 93/05489 | 3/1993 |
| WO | WO 00/16277 | 3/2000 |
| WO | WO 00/16280 | 3/2000 |
| WO | WO 00/41148 | 7/2000 |
| WO | WO 01/25817 | 4/2001 |
| WO | WO 01/50547 | 7/2001 |
| WO | WO 01/67413 | 9/2001 |
| WO | WO 01/71686 | 9/2001 |
| WO | WO 01/73864 | 10/2001 |
| WO | WO 01/80174 | 10/2001 |
| WO | WO 2004/016454 | 2/2004 |
| WO | WO 2004/072892 | 2/2004 |
| WO | WO 2004/025554 | 3/2004 |
| WO | WO 2004/046762 | 6/2004 |
| WO | WO 2004/074016 | 9/2004 |
| WO | WO 2005/006243 | 1/2005 |
| WO | WO 2005-070143 | 8/2005 |
| WO | WO 2005/076205 | 8/2005 |
| WO | WO 2005/089143 | 9/2005 |
| WO | WO 2005/109308 | 11/2005 |

* cited by examiner

METHOD OF DETERMINING PERFORMANCE OF RFID DEVICES

BACKGROUND OF THE INVENTION

1. Field of the Invention

This invention relates to the field of radio frequency identification (RFID) devices, and specifically to methods for determining or predicting performance of such RFID devices.

2. Description of the Related Art

Radio frequency identification (RFID) tags and labels (collectively referred to herein as "devices") are widely used to associate an object with an identification code. RFID devices generally have a combination of antennas and analog and/or digital electronics, which may include for example communications electronics, data memory, and control logic. For example, RFID tags are used in conjunction with security locks in cars, for access control to buildings, and for tracking inventory and parcels. Some examples of RFID tags and labels appear in U.S. Pat. Nos. 6,107,920, 6,206,292, and 6,262,692, all of which are hereby incorporated by reference in their entireties.

As noted above, RFID devices are generally categorized as labels or tags. RFID labels are RFID devices that are adhesively or otherwise have a surface attached directly to objects. RFID tags, in contrast, are secured to objects by other means, for example by use of a plastic fastener, string or other fastening means.

RFID devices include active tags and labels, which include a power source, and passive tags and labels, which do not. In the case of passive tags, in order to retrieve the information from the chip, a "base station" or "reader" sends an excitation signal to the RFID tag or label. The excitation signal energizes the tag or label, and the RFID circuitry transmits the stored information back to the reader. The "reader" receives and decodes the information from the RFID tag. In general, RFID tags can retain and transmit enough information to uniquely identify individuals, packages, inventory and the like. RFID tags and labels also can be characterized as to those to which information is written only once (although the information may be read repeatedly), and those to which information may be written during use. For example, RFID tags may store environmental data (that may be detected by an associated sensor), logistical histories, state data, etc.

It is often desirable to test the performance of RFID devices to ensure acceptable levels of performance. Such tests have often been performed under controlled simulated conditions. For example, tags may be individually tested at a distance similar to that expected in actual use of the tag, in order to determine if the tag or other device performs acceptably.

There are several potential problems with this sort of testing. First, such testing requires a relatively large space. Second, the process does not support a high volume manufacturing environment. Third, the results of such testing may be affected by a variety of factors, such as changes in the environment around the tested RFID device. This may result in a need for careful control of the environment in which the testing is performed, for example by maintaining position of any electrically conductive items in the vicinity of the test. In order to maintain repeatability of testing, it may be desirable to utilize test chambers that isolate the tested device from the surrounding environment. It will be appreciated that under some circumstances it may be necessary to isolate devices individually when performing testing, in order to prevent the response from one RFID device with interfering with the response from other nearby devices. Thus, it will be appreciated that performing such testing on closely spaced devices, such as devices on a sheet or a roll, may be impractical and/or expensive.

From the preceding, it will be appreciated that improvements in testing of RFID devices would be desirable.

SUMMARY OF THE INVENTION

According to an aspect of the invention, a method of predicting or determining performance of an RFID device includes predicting or determining far-field performance based on results from near-field testing or measurement.

According to another aspect of the invention, a method of determining far-field performance of an RFID device includes measuring near-field performance, and mathematically converting one or more of the near-field performance measurements into a prediction of far-field performance.

According to yet another aspect of the invention, a method of determining or predicting performance of an RFID device includes using near-field test results to predict far-field performance of one or more of the following parameters: range, margin, sensitivity, frequency performance, read sensitivity, write sensitivity, peak operating frequency, and average sensitivity over a given frequency band.

According to still another aspect of the invention, a method of determining far-field performance of an RFID device includes the steps of: performing near-field testing on the RFID device; and determining the far-field performance of the RFID device from test results of the near-field testing.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, which are not necessarily to scale.

DETAILED DESCRIPTION

Figure 1:
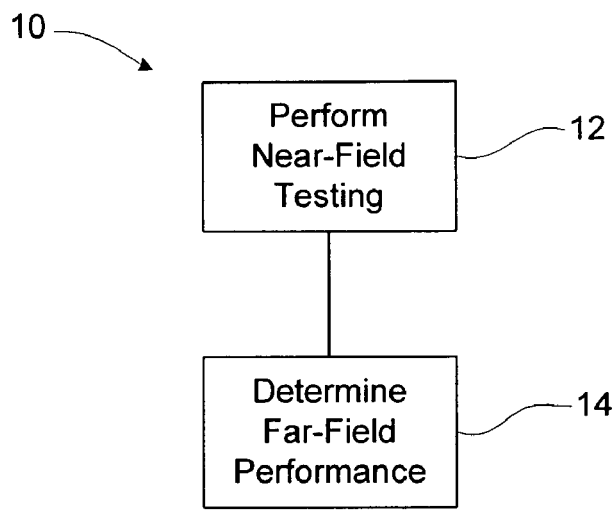
FIG. 1 is a high-level flowchart of a method in accordance with the present invention.

A method of determining far-field performance of an RFID device, such as in or on a tag, label, package, film, carton, wrap, or a portion of any of these, includes performing near-field testing or measurement of the RFID device, and determining or predicting far-field performance based on the results of the near-field testing or measurement. The determining or predicting of far-field performance may involve calculating a measure of far-field performance based on near-field results or measurements. Alternatively, a prediction of the far-field performance may be obtained from other sources, such as from a look-up table based on prior correlations between near-field test results or measurements, and far-field results. The predicted far-field performance may include any of a variety of performance factors, including range, sensitivity, frequency performance, read sensitivity, write sensitivity, peak operating frequency, and/or average sensitivity over a given frequency band. Using near-field testing results to predict far-field performance may allow use of compact testing facilities, in situ testing of RFID devices, and/or faster and/or less costly testing of RFID devices.

Before proceeding to a description of the method, some relevant definitions are provided of terms and phrases used herein. A "transponder chip" or "chip" is defined as a device for providing suitable interaction, through an antenna, for communication with an external device, such as a reader. A chip may include any of a variety of suitable electrical components, such as resistors, capacitors, inductors, batteries, memory devices, and processors. It will be appreciated that a large variety of transponder chips for RFID devices are widely known. The term "transponder chip" is intended to encompass the broad range of such devices, which may vary widely in complexity and functionality.

The term "RFID device" as used herein, is broadly defined to include devices with a chip coupled to an antenna for communication with an external device. An RFID device may be included in or on a tag, label, package, film, carton, wrap, or a portion of any of these. In an RFID device the chip may be coupled to the antenna by any of a wide variety of means. For example, there may be direct electrical connection between the antenna and contacts on the chip. Alternatively, the chip may be part of an interposer or strap that is in turn operatively coupled to the antenna. The chip may be coupled to the antenna by direct, ohmic electrical connection. Alternatively, or in addition, indirect electric couplings, such as capacitive and/or magnetic couplings, may be used to operatively couple the chip to the antenna.

The RFID device may include other layers and/or structures in addition to the chip and the antenna. Examples of such additional layers include a substrate, such as a paper or polymer material substrate, for supporting the chip and/or the antenna; protective layers; adhesive layers; and information-bearing layers, for example, printed layers having words and/or graphics.

Primarily, the antenna of an RFID device is used for long-range far-field RF coupling to external devices, such as suitable readers. The far field, as used herein, refers to a distance greater than on the order of 15 mm from an RF-energy emitting device, such as a device that emits UHF RF energy. Coupling of an RFID device in the far field may also be referred to as "long-range coupling." The near field, where short-range coupling may occur, is defined as within on the order of 15 mm from an RF-energy emitting device. A more precise boundary of the space between the near field and the far field for electrically small dipoles, called the reactive field, may be $\lambda/2\pi$, where $\lambda$ is the wavelength of the RF energy of the RF coupling. Such a definition may be found in IEEE Standard Test Procedures for Antennas, IEEE Std 149-1979, Appendix A, p 139. For RF energy of 915 MHz, the boundary between the near field and the far field would be about 52 mm from the device, using this definition.

The boundary between the near field and the far field may also be defined in terms of the largest dimension of a receiving aperture of the RFID device, and the wavelength of the RF signal. The boundary may be defined by the equation $r=2D^2/\lambda$, where r is the minimum distance where the far field dominates (the boundary between the near-field and the far-field), D is the largest dimension of a receiving aperture of the RFID device, and $\lambda$ is the wavelength of the RF signal. In less specific terms, the near field may be defined as a spatial region between a transmission source and receiving aperture where the transmitted wave front has not had sufficient time (or distance) for amplitude to decay at $1/r^2$. The near field is comprised of reactive and radiating regions. The reactive region exists in space immediately surrounding a transmitting aperture, such as an aperture of a reader, tester, or other transmitter. The radiating region exists in the space beyond the reactive region. The amplitude of the transmitted signal in the radiating region decays as $1/r$, where r is the distance between the transmission source and the receiving RFID device. In the far field, the amplitude of the transmitted signal decays generally as $1/r^2$.

A "near-field tester" is defined herein as a tester for communicating with an RFID device within the near field. The tester may include a reader operatively coupled to the coupler. The coupler, which may include an antenna and/or an aperture, is used to send and/or transmit signals between the tester and an RFID device. A reader is used to interpret return signals received by the coupler, and may be used to control signals sent via the coupler.

A "non-radiating near-field coupler" is defined as a coupler having certain characteristics that make it suitable for performing near-field testing or measurement as described below. Such characteristics include one more of the following characteristics: a configuration that minimizes cross-coupling to adjacent RFID devices; providing a good RF match to the RFID device load over a frequency band of interest; the capability to drive the RFID device with two signal paths, one in phase (0°) and the other anti-phase (180°) over the frequency range of interest; the capability of presenting a good match to the reader when RFID devices are in view and out of view over the frequency band of interest; and having a feed circuit using TEM-type circuit design techniques (strip line flash micro strip topology) to avoid stray radiation from circuit components and/or connection joints, which may otherwise cause problems with cross-coupling to adjacent RFID devices.

Referring now to FIG. 1, a method 10 of determining or predicting far-field performance of an RFID device includes performing short-range near-field testing or measurement of the device, in step 12. Using data gained by the near-field testing or measurement, in step 14 long-range far-field performance is determined or predicted. The method 10 broadly embraces the core concept of using data from near-field operations to predict or determine far-field performance of an RFID device. The data gathered in the near-field testing or measurement may be any of a wide variety of performance data, such as, but not limited to device sensitivity (the minimum incident power level at which the RFID device starts to respond to external signals), margin, peak operating frequency, worst case operating frequency, frequency performance response shape, average response over a selected frequency band, read sensitivity of the RFID device (sensitivity for read operations), or write sensitivity of the RFID device (sensitivity for write operations). The data obtained in the near-field testing may include any of a variety of suitable analog measurements. The far-field device performance determined or predicted from the gathered near-field testing data may include any of a variety of suitable performance measures. In addition to far-field performance measures that correspond to the near-field data described above, the predicted far-field performance may include more abstract characterizations of far-field performance, such as whether a device meets a predetermined far-field performance criterion or standard.

Thus the determination or prediction of far-field performance may include a simple pass-fail determination of whether an RFID device meets a predetermined performance criterion. It should be noted, however, that any simple performance criterion is based on far-field performance of the RFID device, and its satisfaction or lack thereof is based at least in part on the near-field test results.

The use of near-field testing or measurement results to generate a prediction or determination of far-field performance should be interpreted broadly to include a large variety of suitable ways of predicting far-field performance based at least in part on near-field test results. The determining or predicting may be a straight mathematical method that direct mathematically manipulates the near-field test results, such as by use of an equation or formula, to provide a numerical indication of some aspect of far-field performance. Alternatively, a look-up table or chart may be utilized to provide predicted far-field device performance based on near-field measurements. As another alternative, data from a database of prior devices subjected both to near-field and far-field testing may be used to provide a prediction of far-field performance from near-field test results or measurements. Appropriate interpolations and extrapolations may be made from tests results on previous devices.

In addition, suitable curve-fitting methods may be used to derive predictive mathematical algorithms from sets of near-field and far-field performance data. Suitable methods may also be used to interpolate or extrapolate using such data.

As a further alternative, it will be appreciated that simple pass-fail results for far-field performance may be determined based on suitable thresholds or performance levels in near-field testing. Also, it will be appreciated that factors other than near-field test results or measurements may be used in determining far-field performance. For example, different types of compensation factors may be used to compensate for differences in device and/or test or configurations. Further, it may be possible to utilize some far-field test data or measurements in determining or predicting far-field performance based in part on near-field test results or measurements. In general, reference herein to determining far-field performance based on near-field data or measurements refers broadly to situations where the prediction is based at least in part on near-field data or measurements.

Figure 2:
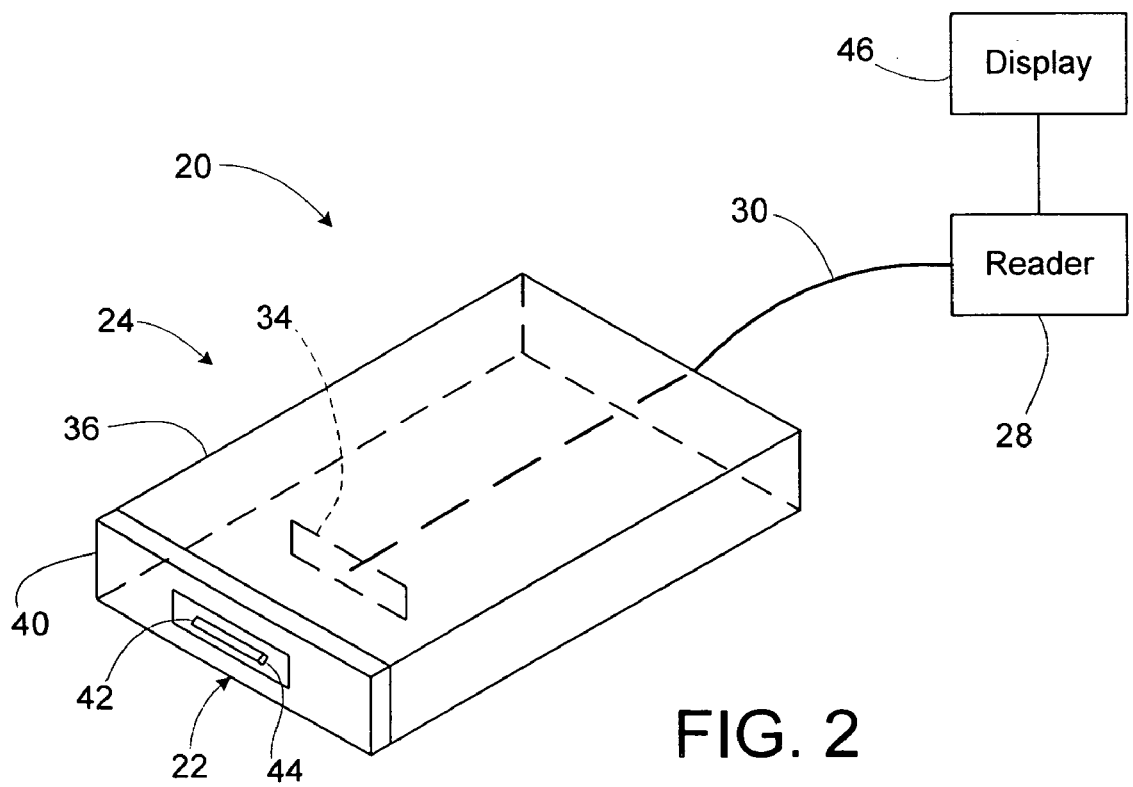
FIG. 2 is a partially schematic diagram of a near-field tester used in the method of FIG. 1.

FIG. 2 shows a tester 20 that may be used to perform near-field testing of an RFID device 22. The tester 20 includes a test head 24 that is coupled to a reader 28 by a cable 30. The test head 24 includes a near-field coupler 34. The near-field coupler 34 is placed within a dielectric material block 36. The dielectric material block 36 may be a block of low dielectric constant material, for example a block of a suitable polymer material, such as polystyrene. The block 36 maintains the near-field coupler 34 at a specified suitable distance from a compliant surface 40 upon which the RFID device 22 is placed. The compliant surface material 40 may be a suitable polymer foam. The near-field coupler 34 is located in a specified proximity to the compliant surface 40. The near-field coupler 34 may advantageously have the characteristic that it induces current and voltage in all critical parts of the antenna structure 42 of the RFID device 22.

A power source and software within the reader 28 send a suitable signal through the cable 30 to the near-field coupler 34. The RF signal emanating from the near-field coupler 34 interacts with an antenna 42 and a chip 44 of the RFID device 22. This interaction causes an active or passive response from the RFID device 22. This response is received by or otherwise affects the near-field coupler 34. These effects can be measured by the software in the reader 28. The measurement results may be displayed on a display 46 that is coupled to the reader 28. Alternatively or in addition, it will be appreciated that the results may be stored using suitable data storage devices, and/or transmitted to other processors. As a further alternative, it will be appreciated that the software of the reader 28 may itself make the prediction or determination of the far-field performance of the RFID device 22, based on the measurements made.

It will be appreciated that the measurements made by the tester 20 may be any of a large variety of measurements described earlier. The testing may involve making multiple types of measurements and/or making measurements at multiple operating conditions, such as at multiple frequencies.

It will be appreciated that other components may be used as part of the near-field tester 20. For example, an isolation chamber may be utilized to aid in isolating a device under test from external items, which might otherwise interfere with performance. However, it will be appreciated that near-field testing may be much less susceptible to such interference than conventional far-field testing.

Figure 3:
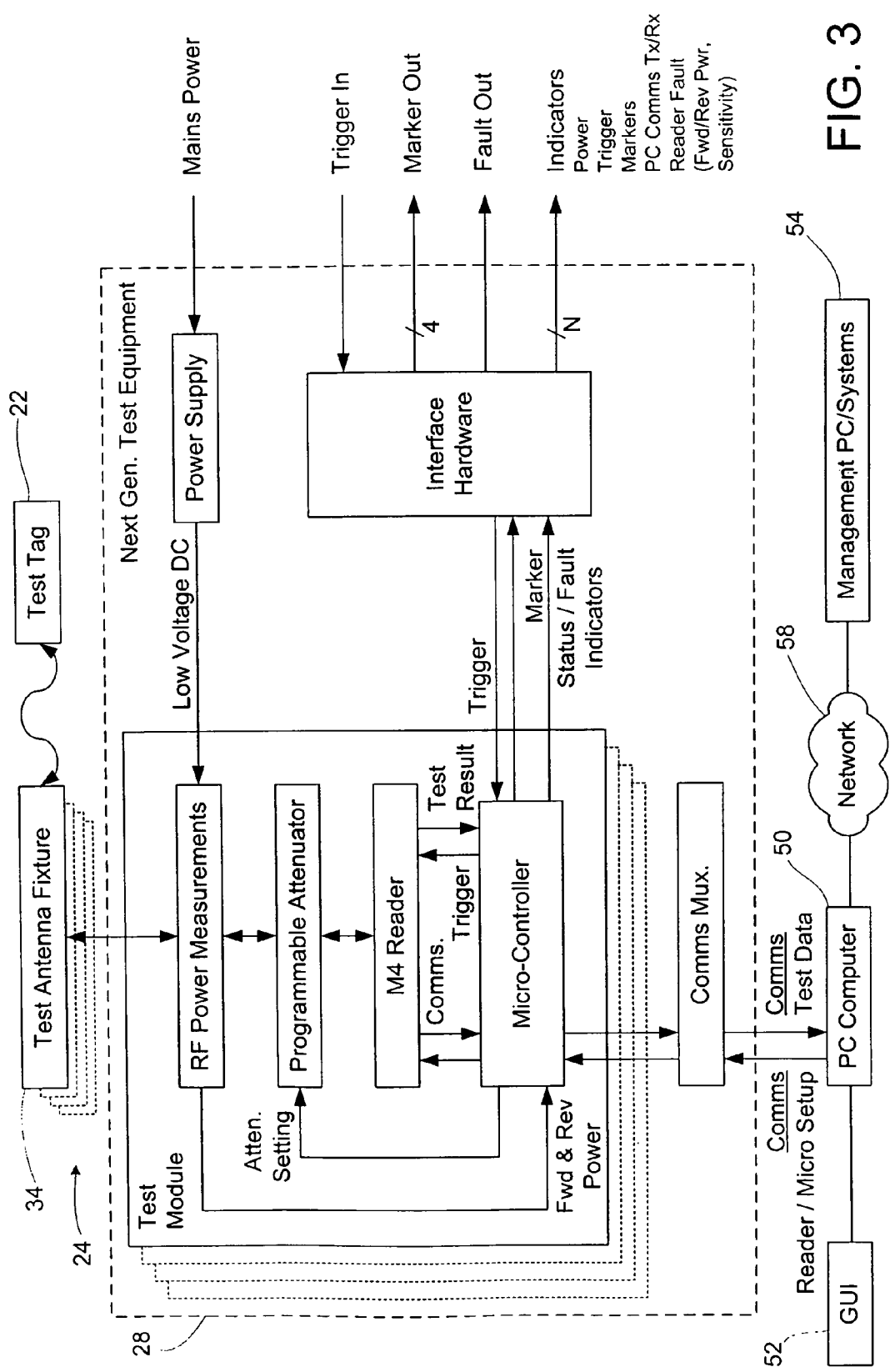
FIG. 3 is a functional representation of the near-field tester of FIG. 2.

FIG. 3 shows a functional diagram of the tester 20. The functional diagram shows how various signals and data may be transferred between the reader 28 and the test head 24, and may be moved within various internal hardware and software components of the reader 28. FIG. 3 also shows various external devices that may be coupled to the reader 28, including a PC computer 50, a graphical user interface (GUI) 52 (which may be part of the display 46), and auxiliary or management computers 54, which may be coupled to the computer 50 over a network 58.

What is described now is the derivation of an equation for determining or predicting far-field sensitivity performance based on near-field sensitivity performance. It will be appreciated that this is but one example of the many sorts of ways that near-field data may be used to determine or predict the far-field device performance.

The near-field margin (the excess power over the RFID device sensitivity) may be represented as:

$$M_{nf}(\text{dB}) = P_r - \sigma_1 - \sigma_2 - \rho_{nf} - S \tag{1}$$

In this equation, $M_{nf}$ is the near-field margin; $P_r$ is the RFID reader output power (dBm) (typical value: +30 dBm); $\sigma_1$ is the coupling coefficient for the near-field radiating region (dB)=10*log(1/r), where r is the free space distance between the RFID device and the coupler; $\sigma_2$ is the coupling efficiency between the coupler and RFID device (dB)=10*log(A2/A1), where A1 is the coupling area of the coupler, and A2 is the overlapping area of the RFID device; $\rho_{nf}$=Mismatch Loss of the RFID inlay in the near-field (dB)=10*log(1−$\rho^2$), where $\rho$ is the reflection coefficient, with $\rho$=(VSWR−1)/(VSWR+1)=10^(return loss(dB)/20), where VSWR is the voltage standing wave ratio, the ratio of reflected voltage to transmitted source voltage; and S is the minimum RF power required for the IC to operate.

The far-field margin may be represented as:

$$M_{ff}(\text{dB}) = P_t + G_{tx} - L_{range} - \rho_{ff} - S \tag{2}$$

In this equation, $M_{ff}$ is the near-field margin; $P_t$ is the RFID reader output power (dBm); $G_{tx}$ is the gain of the transmit antenna (dBi), the gain of the typical RFID far-field reader antenna (typical value +6.0 dBi); $L_{range}$ is the space loss between the transmit antenna and the inlay=10*log[(4πr/λ)

$^2$](=31.68 dB at 1 m range and 915 MHz frequency); $\rho_{ff}$ is the mismatch loss of the RFID inlay in the far-field (dB) =10*log(1−$\rho^2$), where $\rho$ is the same reflection coefficient referred to above; and S is the minimum RF power required for the IC to operate in the near field. The reflection coefficients $\rho_{ff}$ and $\rho_{nf}$ need to be characterized/measured for the typical RFID device. A typical RFID device has a reflection coefficient of $\rho_{ff}$ in the far-field (free space) but in the near-field, the coupler can load the RFID device, changing its impedance to $\rho_{nf}$. The reflection coefficient also changes in the presence of metals, liquids, and other dielectric materials.

Equations (1) and (2) may be combined as follows. First, both equations may be solved for their respective sensitivities:

$$S = P_t - \sigma_1 - \sigma_2 - \rho_{nf} - M_{nf} \quad (5)$$

$$S = P_t + G_{tx} - L_{range} - \rho_{ff} - M_{ff} \quad (6)$$

By substitution, $$P_t - \sigma_1 - \sigma_2 - \rho_{nf} - M_{nf} = P_t + G_{tx} - L_{range} - \rho_{ff} - M_{ff} \quad (7)$$

Solving for $M_{ff}$ and removing like terms yields the expression, $$M_{ff} = G_{tx} - L_{range} - \rho_{ff} + \sigma_1 + \sigma_2 + \rho_{nf} + M_{nf} \quad (8)$$

Equation (8) gives a simple expression for predicting or determining the far-field margin from the near-field margin.

In utilizing the method 10, data may be gathered from testing of multiple RFID devices 22 using both near-field and far-field testing. This data may be processed and used to create a table or algorithm for perfecting performance of an RFID device in a known condition with a defined accuracy. To give a simple example, a single frequency test on one near-field tester of an RFID device may be enough to predict far-field performance to a specified accuracy, such as ±0.5 dB. In a more complex example, multiple measures at different frequencies on different test systems may be combined to allow reliable predictions of not only far-field performance in general, but also the far-field performance when attached to a range of products, some of which may affect the device operating frequency and bandwidth.

The method 10, then, may involve use of an algorithm or a set of algorithms, that are adapted in nature in order to differentiate far-field performance of RFID devices, based on near-field test data. The algorithm or algorithms may be used to create an index table that provides for decision-making on the usefulness of an RFID device to an end user's requirements. The index table may have ranges of utility associated with them for different categories of use and device performance such that a set of read performance input may provide a basis for accepting the device in some applications and rejecting the device in others. For example, different standards may be employed for devices to be attached to electrically-conducting objects, such as metal cans, versus devices attached to objects which do not conduct electricity, such as plastic bottles. More broadly the method 10 may be used to predict performance of RFID devices in different environments, such as in proximity to different types of objects, and/or in environments with different types of possible competing RF signals. It will be appreciated that a wide variety of other variants may be possible in operating environment.

Thus a wide variety of characteristics of far-field frequency performance response may be predicted or determined from near-field frequency performance of the RFID device. Different devices with the same average response over a certain frequency band may be suitable for different types of environments, for example.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of determining far-field performance of an RFID device, the method comprising:
    performing near-field testing on the RFID device;
    determining the far-field performance of the RFID device from test results of the near-field testing;
    wherein the determining includes using a mathematical algorithm to determine the far-field performance; and
    wherein the using the mathematical algorithm includes calculating a far-field performance parameter.

2. The method of claim 1, wherein the performing near-field testing includes:
    placing the RFID device in proximity to a near-field coupler of a near-field tester; and
    sending signals from the tester to the RFID device, using the near-field coupler, and a reader of the tester.

3. The method of claim 2, wherein the sending signals includes sending signals over a range of frequency.

4. The method of claim 2, wherein the performing near-field testing further includes the tester receiving signals from the RFID device.

5. The method of claim 2, wherein the tester includes a test head that includes the near-field coupler and a dielectric material block in which the near-field coupler is located.

6. The method of claim 5,
    wherein the test head also includes a compliant surface on the dielectric material block; and
    wherein the testing includes placing the RFID device on the compliant surface.

7. The method of claim 1, wherein the testing includes performing multiple tests.

8. The method of claim 7, wherein the testing includes testing in multiple operating environments.

9. The method of claim 1, wherein the using the mathematical algorithm includes using a look-up chart or table.

10. The method of claim 1, wherein the determining includes determining a numerical far-field performance parameter.

11. The method of claim 1, wherein the determining includes determining whether the RFID device satisfies a far-field performance threshold.

12. The method of claim 1, wherein the determining includes determining one or more of sensitivity, margin, peak operating frequency, frequency performance response shape, average response over a selected frequency band, read sensitivity, and write sensitivity.

13. The method of claim 1, wherein the determining includes determining suitability of far-field performance in different far-field operating environments.

14. The method of claim 1, wherein the testing includes inducing current and voltage in all critical parts of an antenna structure of the RFID device.

15. The method of claim 7, wherein the testing includes testing over a range of frequency.

16. The method of claim 7, wherein the testing includes testing with multiple testers.

* * * * *

UNITED STATES PATENT AND TRADEMARK OFFICE
CERTIFICATE OF CORRECTION

| | | |
|---|---|---|
| PATENT NO. | : 7,154,283 B1 | Page 1 of 1 |
| APPLICATION NO. | : 11/359669 | |
| DATED | : December 26, 2006 | |
| INVENTOR(S) | : Weakley et al. | |

It is certified that error appears in the above-identified patent and that said Letters Patent is hereby corrected as shown below:

Column 7, line 22, replace " Mff " with -- $M_{ff}$ --.

Signed and Sealed this

First Day of May, 2007

JON W. DUDAS
*Director of the United States Patent and Trademark Office*